United States Patent

Hall

[15] 3,698,071

[45] Oct. 17, 1972

[54] METHOD AND DEVICE EMPLOYING HIGH RESISTIVITY ALUMINUM OXIDE FILM

[72] Inventor: Lou H. Hall, Dallas, Tex.

[73] Assignee: Texas Instruments Incorporated, Dallas, Tex.

[22] Filed: Feb. 19, 1968

[21] Appl. No.: 706,256

[52] U.S. Cl.....................29/571, 29/578, 117/106 R, 117/201, 117/212, 148/1.5, 148/186

[51] Int. Cl.............................B01j 17/34, B44d 1/18

[58] Field of Search........317/235AG; 177/212, 201, 106R, 117/107.2 R, DIG. 12; 29/576, 577, 571, 578; 148/1.5, 186

[56] References Cited

UNITED STATES PATENTS

| | | | |
|---|---|---|---|
| 3,373,051 | 3/1968 | Chu et al | 317/235 AG |
| 3,419,761 | 12/1968 | Pennebaker | 117/217 |
| 3,462,700 | 8/1969 | Berglund et al | 117/DIG. 12 |
| 3,485,666 | 12/1969 | Sterling et al. | 117/106 R |
| 3,511,703 | 5/1970 | Peterson | 117/106 X |
| 3,431,636 | 11/1969 | Granberry | 317/235 |
| 3,422,321 | 1/1969 | Tombs | 117/DIG. 12 |
| 3,396,052 | 8/1968 | Rand | 317/235 |
| 3,298,879 | 1/1967 | Scott, Jr. et al | 148/187 |
| 3,154,439 | 10/1964 | Robinson | 317/235 |
| 3,139,362 | 6/1964 | D'Asaro et al | 317/235 |
| 3,053,683 | 9/1962 | Yolles | 117/107.2 X |
| 2,972,555 | 2/1961 | Deutscher | 117/106 |

*Primary Examiner*—Alfred L. Leavitt
*Assistant Examiner*—Cameron K. Weiffenbach
*Attorney*—Samuel M. Mims, Jr., James O. Dixon, Andrew M. Hassell, Harold Levine, Melvin Sharp, James C. Fails, Gerald B. Epstein and John E. Vandigriff

[57] ABSTRACT

This invention record discloses an improvement in a method for forming aluminum oxide films characterized by being formed from trimethyl aluminum and nitrous oxide at a reaction temperature of 600°–900° C. The films are deposited over components formed in a semiconductor material. By this means a special high resistivity insulating film is formed and a shallow region of P-type conductivity is induced at the surface of the semiconductor material. Also disclosed are electronic devices employing the high resistivity aluminum oxide film.

4 Claims, 4 Drawing Figures

INVENTOR
LOU H. HALL

BY James C. Fails

ATTORNEY

INVENTOR

BY James C. Faits

ATTORNEY

METHOD AND DEVICE EMPLOYING HIGH RESISTIVITY ALUMINUM OXIDE FILM

BACKGROUND OF THE INVENTION

This invention relates to electronic devices employing semiconductor material. More particularly it relates to semiconductor components wherein a high resistivity film is formed thereover.

Although it has been recognized that films other than silicon oxide are often desirable in manufacturing semiconductor components, no suitable high resistivity film has been adequately developed to supplement silicon oxide films. Silicon oxide films have been very useful, but they are not a panacea. For example, although silicon oxide films often induce a region of N-type conductivity, they rarely can be employed to induce P-type conductivity and yet retain the desired high resistivity. Silicon oxide films are also sometimes inadequate in that they allow relatively high leakages and surface currents to take place in certain devices when a P-N junction intersects a semiconductor surface under a silicon oxide film. Moreover, past processes to provide high resistivity films as a substitute for silicon oxide films have employed relatively high temperatures; for example, 1,100°–1,200° C; and formed crystalline films that were difficultly etched, e.g., requiring hot phosphoric acid instead of the usual hydrofluoric acid systems which etch at room temperature. On the other hand, some past processes have employed relatively low temperatures; for example, 300°–400° C; and formed films that did not have adequately high resistivity, lacked flexibility in application and suffered adversely from pinholes and non-uniform coverage.

SUMMARY OF THE INVENTION

Accordingly it is an object of this invention to provide a high resistivity aluminum oxide film. It is a further object of this invention to provide a high resistivity aluminum oxide film which induces a shallow region of P-type conductivity in the surface of the semiconductor material adjacent the aluminum oxide film and thus prevent surface currents and alleviate leakage losses in certain devices. It is a further specific object of this invention to provide a high resistivity aluminum oxide film which is amorphous and can be etched by conventional hydrofluoric acid etching systems, yet still provide an aluminum oxide film which is dense, substantially free of pinholes and covers uniformly the surface of the semiconductor material.

In accordance with the invention there is provided an improvement in a method of forming an electronic device wherein a high resistivity film is provided over a semiconductor material having a component formed therein. The improvement comprises depositing over the surface of the semiconductor material a film of aluminum oxide formed by the reaction of trimethyl aluminum and nitrous oxide at 600°–900° C whereby a high resistivity insulating film that can be readily etched by conventional hydrofluoric etching systems is formed, and a shallow region of P-type conductivity is induced at said surface of said semiconductor adjacent said film.

DESCRIPTION OF SPECIFIC EMBODIMENTS

Figure 1:
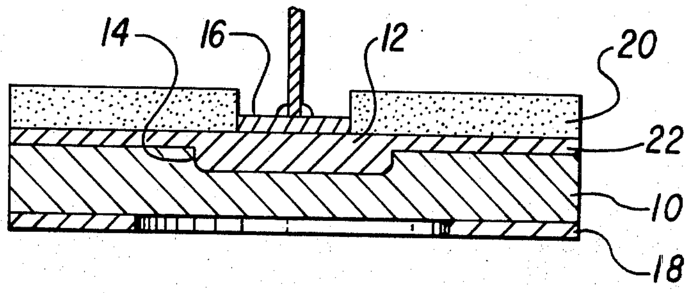
FIG. 1 is a cross sectional view of one embodiment employing the invention.

One embodiment which illustrates the invention is shown in FIG 1. Therein substrate 10 of N-type semiconductor material contains a region 12 of P-type semiconductor material. The semiconductor material, as used herein, may be any of the well known materials employed in diode construction. For example it may be silicon, germanium or Group III-V compounds such as gallium arsenide. This embodiment is particularly advantageous in photon-emitting gallium arsenide diodes. The diode performance is effected by P-N junction 14 between the regions of opposite conductivity type. Ohmic contacts 16 and 18 on opposite sides of the P-N junction 14 effect electrical continuity in the circuit in which the diode is employed.

Insulating film 20 is aluminum oxide formed by reaction of trimethyl aluminum vapor in an inert gas stream and nitrous oxide in an inert gas stream, the reaction proceeding at a temperature between 600°–900° C, inclusive. In this way a homogenous, dense film of high purity aluminum oxide is deposited which has high resistivity, e.g., about $10^{14-15}$ ohm-centimeters. Additionally the aluminum oxide film induces a shallow region 22 of P-type conductivity in the surface contiguous with film 20. In this way junction 14 does not intersect surface of the semiconductor material in a manner permitting high current densities. Specifically, surface currents and leakage losses are alleviated, since the P region 22 is of high resistivity and prevents appreciable current at the periphery of substrate 10. Device performance is improved still further by passivating the junction at a periphery of substrate 10, particularly in silicon and germanium devices. The junction may be passivated by photoresist plastic or silicon oxide.

Furthermore, the aluminum oxide film formed in accordance with the invention may be employed advantageously in a diode over a substrate 10 of P-type semiconductor material containing a region 12 of N-type semiconductor material. In such a diode, the aluminum oxide film does not permit high surface current densities, since the tendency to induce a shallow region of P-type conductivity partially compensates the surface of N-type region 12 and increases its resistance.

Figure 2:
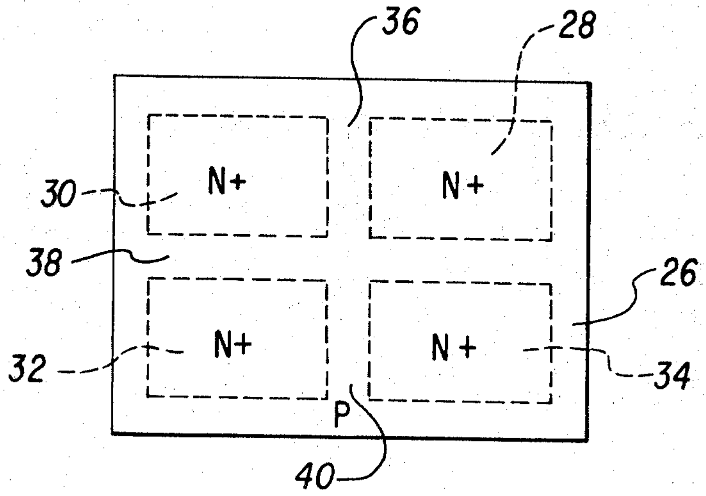
FIG. 2 is a plan view of a wafer on which the film and the method of the invention is particularly effective in effecting the desired results.

Another embodiment in which the aluminum oxide formed in accordance with the method of the invention can be particularly effective is illustrated in FIG. 2. Therein substrate 26 of P-type semiconductor material has diffused thereinto four regions 28, 30, 32 and 34 of $N^+$-type semiconductor material; i.e., semiconductor material containing a high concentration of a donor dopant such as phosphorus, arsenic or antimony. A film 36 of high resistivity aluminum oxide is deposited over substrate 26 and regions 28, 30, 32 and 34, as described briefly in connection with FIG. 1 and in detail hereinafter. In this way the aluminum oxide film not only affords a high resistivity insulating layer but insures that the aisles 38 and 40 separating the regions of $N^+$-type semiconductor material under the aluminum oxide film remain P-type and do not interconnect the regions, as often occurs with insulating films which induce N-type conductivity into the semiconductor material. Although there is some compensation of the $N^+$ conductivity by the tendency toward creating P-type conductivity, this tendency is swamped by the high concentration of donor impurities such that the $N^+$ regions remain N-type conductivity. Thus, when conventional photolithographic techniques are employed to cut holes through the aluminum oxide mask and ohmic contacts emplaced, effective diode behavior is obtained without short circuiting of the regions 28, 30, 32, and 34.

Figure 3:
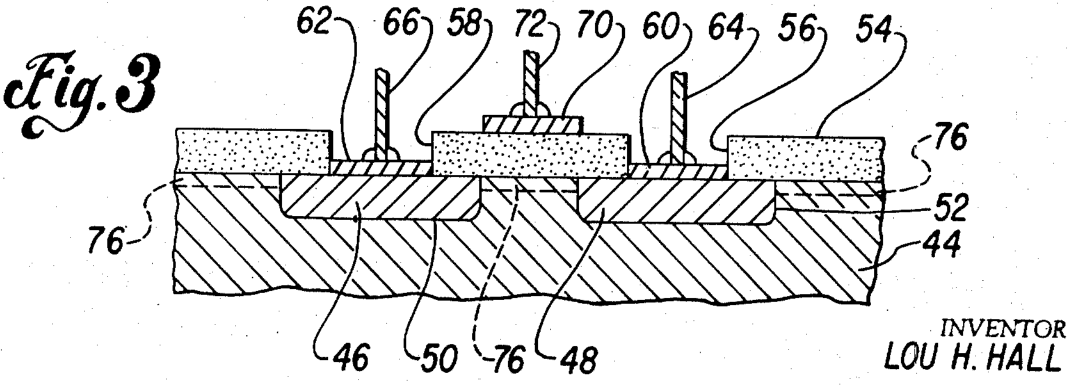
FIG. 3 is a cross sectional view of a metal insulator semiconductor field effect transistor (MIS FET) employing the method and film of the invention.

An embodiment of the invention which is particularly interesting is in the field of metal insulator semiconductor field effect transistors (MIS FET). A cross sectional view of a MIS FET is illustrated in FIG. 3. Therein a semiconductor portion 44 of a body has a specific type of conductivity. Regions 46 and 48 of opposite conductivity are formed therein creating junctions 50 and 52 between these regions and semiconductor portion 44. High resistivity aluminum oxide film 54 is emplaced atop the semiconductor portion 44 as described in connection with FIG. 1 and in more detail hereinafter. Conventional photolithographic mask and etch techniques are employed to form apertures 56 and 58 through the high resistivity aluminum oxide film. Ohmic contacts 60 and 62 are formed through apertures 56 and 58 to regions 46 and 48. Ohmic contacts 60 and 62 are connected with another part of an electrical circuit by conductors 64 and 66, shown as external conductors for simplicity. In this way regions 46 and 48 serve as source and drain for a MIS FET.

The gate for the MIS FET is formed by emplacing metal layer 70 atop aluminum oxide film 54 and connecting it elsewhere in the circuit through a conductor 72, shown as an external conductor for simplicity.

Since a shallow P-type region 76 is formed under the high resistivity aluminum oxide insulating layer, two new types of MIS FET devices become practical which could not be practically made heretofore.

One of these new MIS FET'S made practical is a field effect transistor in which the source and drains 46 and 48 are N-type conductivity semiconductor material and portion 44 is P-type semiconductor material. This is referred to as an enhancement type MIS FET operated by application of a positive voltage to the gate. Functionally, the N-type regions 46 and 48 are isolated from each other by P-type semiconductor material both in the portion of the body 44 and in the surface channel region 76. Therefore, before voltage is applied to the gate the field effect transistor is not operational. It may be turned on by application of a positive voltage to gate 70. The positive voltage attracts negative carriers, i.e., electrons, into; and concommitantly repels positive carriers, i.e., holes, from; the channel region 76 between the source and the drain, making the channel region N-type conductivity and allowing conduction between regions 46 and 48. Conversely, the field effect transistor is turned off by removal of the positive voltage from gate 70 allowing the innate P-type channel to be returned to P-type conductivity again isolating regions 46 and 48. This type of MIS FET has not been practical heretofore because most insulating films induced a region of N-type conductivity in the surface contiguous with the film. Since the electron mobility is greater than that of holes in silicon, it is advantageous to produce a silicon MIS FET operating with N-type channel and enhancement mode for increased speed.

The other type of MIS FET made practical by employing the high resistivity aluminum oxide film is an N-type portion 44 containing P-type regions 46 and 48 that is innately conductive since channel region 76 is P-type and conducts between P-type regions 46 and 48. The field effect transistor is turned off by the application of the positive voltage of sufficient magnitude at gate 70, repelling positive carriers and attracting negative carriers into channel region 76. That is, channel region 76 becomes effectively N-type conductivity and isolates P-type regions 46 and 48. This is referred to as operating in the depletion mode since the field effect transistor is turned off by the application of a positive voltage at the gate.

Figure 4:
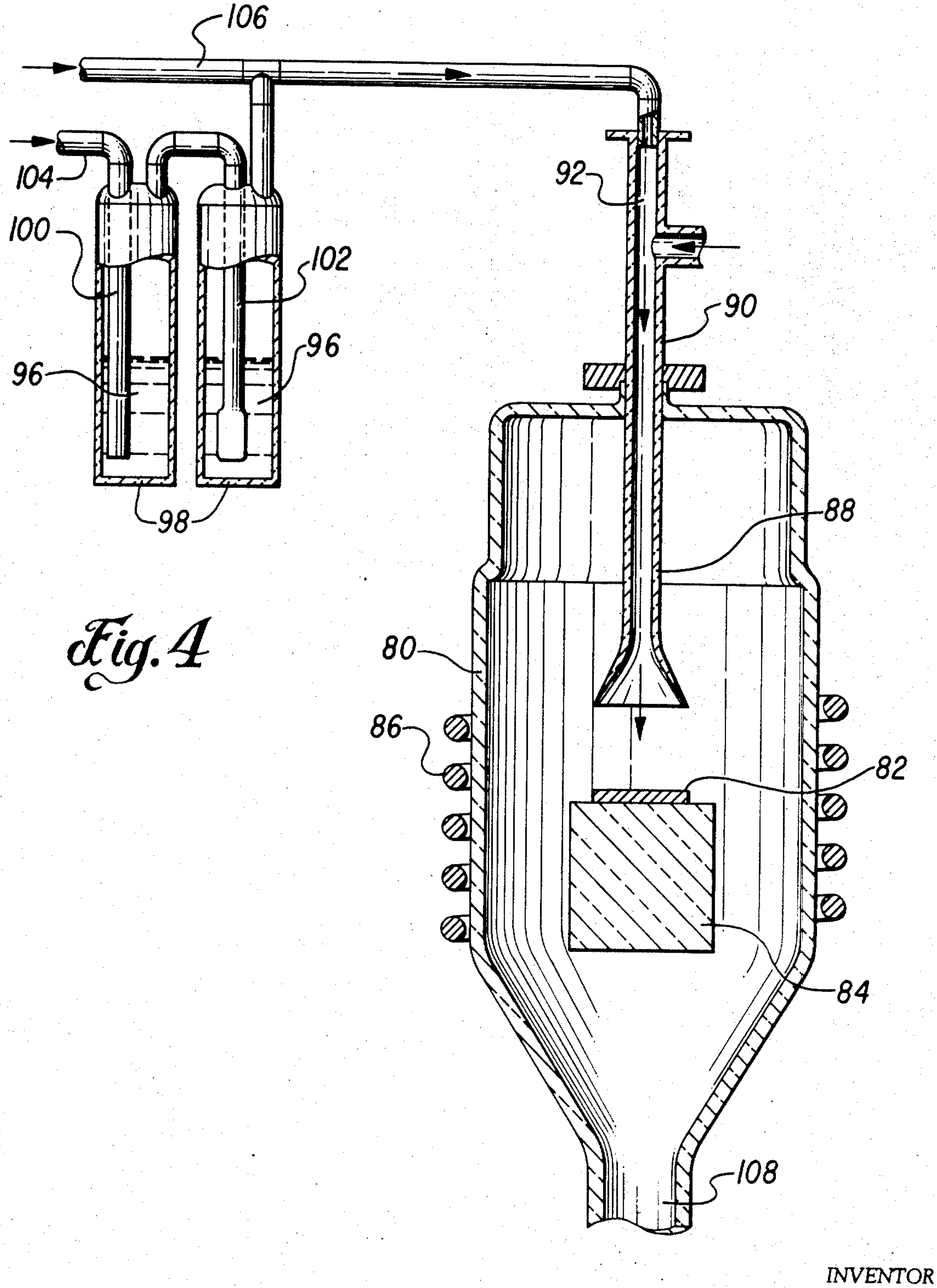
FIG. 4 is a cross sectional view, partly in schematic of the reactor and feed system enabling the method of the invention to be performed.

Apparatus which can be employed to deposit the high resistivity aluminum oxide film is illustrated in FIG. 4. Inside reactor 80, in FIG. 4, a slice 82 of semiconductor material is mounted on a susceptor 84. Reactor 80 may be constructed of any material capable of constraining the gases without imparting impurities thereto at the temperature at which the aluminum oxide film is deposited. For example, quartz is an excellent material from which to construct reactor 80. As noted hereinbefore, semiconductor material may be any of the conventionally employed semiconductor materials such as silicon, germanium or Group III-V compounds such as gallium arsenide. The susceptor 84 may be any material which, like reactor 80, will withstand the temperature of deposition without imparting impurities to the aluminum oxide film. For example susceptor 84 may be carbon encapsulated in quartz. Susceptor and semiconductor slice 82 is heated, e.g., by radio frequency coils 86, to the deposition temperature.

The reactants are fed, in separate streams, into mixing chamber 88 where they are mixed in the gaseous phase before being brought into the vicinity of semiconductor slice 82 at the reaction temperature. To effect thorough mixing in mixing chamber 88, it is desirable to effect turbulent flow. For example, the nitrous oxide ($N_2O$) may be fed into the annular region 90 in an inert carrier gas. Suitable inert gases for use as carrier gas include helium, neon, argon or even krypton, xenon, and nitrogen. Argon is particularly suitable and is used in the following description. Trimethyl aluminum is carried with the argon into mixing chamber 88 through tubing 92. A particular advantage of the invention is that the trimethyl aluminum 96 in containers 98 has a high enough vapor pressure to effect without heating an adequate concentration in the inert carrier gas passed through bubbler 100 and fritted bubbler 102 in containers 98. Thus, the argon flowed through containers 98 via pipes 104 and bubblers 100 and 102 will contain sufficient trimethyl aluminum vapor. It is then mixed with additional carrier gas through pipe 106 and carried into reactor 80.

While it is desirable to effect turbulent flow in mixing zone 88, it is desirable to flare the exit from the mixing zone to effect essentially laminar flow immediately adjacent semiconductor slice 82 and effect more nearly uniform deposition of the aluminum oxide. The desired laminar flow, i.e., a Reynolds number less than 2,000, can be effected by adjusting the height of the bottom of the mixing zone 88 from semiconductor slice 82. For example, where only a single slice is being employed a distance of between 0.75 and 0.80 inches will effect the desired laminar flow and substantially uniform deposition of aluminum oxide.

After the reaction and deposition of the aluminum oxide film, the product gases from the reaction are passed out vent 108.

The temperature at which the reaction is carried out is 600°–900° C. By using at least 600° C for the reaction, the aluminum oxide which is formed will have a resistivity of $10^{14-15}$ in contrast to films formed at 300°–400° C which have a resistivity of $10^{9-10}$ ohm-centimeters. By constraining the temperature to 900° C or below, a crystalline film that is difficult to etch is avoided and an amorphous film that is readily etched by conventional hydrofluoric etching solutions is formed. Nitrous oxide is a particularly effective source of oxygen since no oxidation is provided until a temperature of about 600° C is reached.

In forming an aluminum oxide film over a single slice of semiconductor material I have employed 5–6 cubic centimeters per minute (cc/min) of argon bubbling through containers 98 to entrain trimethyl aluminum vapor at a temperature of 23° C. At 23° C the trimethyl aluminum has a vapor pressure of about 11 millimeters of mercury so about one-half cc per minute of trimethyl aluminum vapor will be entrained in the resulting effluent mixture carried into pipe 106. There the mixture is further diluted with about 80 cc per minute of argon. Into annular region 90 I have introduced about 40 cc per minute of nitrogen oxide carrying about 65 cc per minute of argon. At relatively low flow rates; e.g., about 200 cc/min of gaseous reactants and carrier gas; to deposit a film on a single slice in a small reactor, it is preferable to employ a temperature of from 600°–700° C. Otherwise, there is a tendency for premature reaction in the gas phase before the reactants have moved to the semiconductor slice, and for non-uniform and granular deposition.

In a larger reactor, in which four semiconductor slices had a film of aluminum oxide formed thereover simultaneously, I employed the same amount of 5–6 cc/min of argon bubbled through the containers of trimethyl aluminum mixed with about 2,000 cc/min of argon. About 157 cc/min of nitrous oxide, carried in about 2,000 cc/min of argon was introduced into annular region 90. A funnel having a diameter of about 4 inches was provided at the exit to mixing chamber 88 and was less than 1 inch from the slices. A mixing chamber of several inches; e.g., 7 ½ inches; was sufficient to get uniform mixing of the reactants such that a substantially uniform film of aluminum oxide was deposited on the semiconductor slices. Moreover, at high flow rates; e.g., about 4,000 cc/min of reactants and carrier gas; the full range of 600°–900° C temperatures can be employed and effect uniform deposition of aluminum oxide.

By employing the method of the invention, aluminum oxide films have been formed which have uniform refractive indices of about 1.75 with less than 1 percent variation across the slice. The resulting aluminum oxide film has a dielectric constant which is roughly twice as great as a film of silicon dioxide. In addition to the uses enumerated hereinbefore, the aluminum oxide film can be employed in making a metal-insulator-semiconductor (MIS) varactor to make effective use of this increased dielectric constant.

Having thus described the invention, it will be understood that such description has been given by way of illustration and example and not by way of limitation. The appended claims define the scope of the invention for that purpose.

What is claimed is:

1. In a method of forming an electronic semiconductor device in a semiconductor material, the improvement comprising contacting the semiconductor material with a mixture consisting essentially of an inert carrier gas, trimethyl aluminum, and nitrous oxide at 600° – 900° C., whereby a film of aluminum oxide is deposited thereon.

2. In a method of forming an electronic device the improvement comprising:

a. forming at a surface of a semiconductor portion of a body a component, b. depositing over said component and said surface a film of aluminum oxide formed by the reaction of trimethyl aluminum and nitrous oxide at 600° – 900° C whereby a high resistivity insulating film is formed and a shallow region of P-type conductivity is induced at said surface, c. opening apertures in said aluminum oxide film over selected regions of said component in said semiconductor portion of said body, d. affixing ohmic contacts through said apertures to said selected regions.

3. The method of claim 2 wherein said trimethyl aluminum and said nitrous oxide are gaseous reactants and admixed with an inert carrier gas, said aluminum oxide film is formed at a flow rate of gaseous reactants and carrier gas of about 200 cc per minute, and a temperature of 600°–700° C is employed.

4. The method of claim 2 wherein said trimethyl aluminum and said nitrous oxide are gaseous reactants and admixed with an inert carrier gas, said aluminum oxide film is formed at a flow rate of about 4,000 cc per minute of said gaseous reactants and carrier gas, and a temperature of 600°–900° C is employed.

* * * * *